United States Patent
Chen

(10) Patent No.: US 9,520,195 B2
(45) Date of Patent: Dec. 13, 2016

(54) SENSING AMPLIFIER UTILIZING BIT LINE CLAMPING DEVICES AND SENSING METHOD THEREOF

(71) Applicant: MACRONIX INTERNATIONAL CO., LTD., Hsinchu (TW)

(72) Inventor: Chung-Kuang Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 108 days.

(21) Appl. No.: 14/049,257

(22) Filed: Oct. 9, 2013

(65) Prior Publication Data

US 2015/0098279 A1    Apr. 9, 2015

(51) Int. Cl.
| | |
|---|---|
| G11C 16/06 | (2006.01) |
| G11C 16/04 | (2006.01) |
| G11C 7/08 | (2006.01) |
| G11C 7/06 | (2006.01) |
| G11C 16/26 | (2006.01) |
| G11C 16/10 | (2006.01) |

(52) U.S. Cl.
CPC .............. *G11C 16/06* (2013.01); *G11C 7/065* (2013.01); *G11C 7/067* (2013.01); *G11C 7/08* (2013.01); *G11C 16/26* (2013.01); *G11C 16/0483* (2013.01); *G11C 16/10* (2013.01)

(58) Field of Classification Search
CPC ........... G11C 7/08; G11C 7/067; G11C 16/06; G11C 16/10; G11C 16/0483; G11C 16/26; G11C 7/065
See application file for complete search history.

(56) References Cited

U.S. PATENT DOCUMENTS

| | | | |
|---|---|---|---|
| 2005/0029051 A1* | 2/2005 | Hosono et al. | 185/17 |
| 2008/0158986 A1* | 7/2008 | Elmhurst et al. | 365/185.21 |
| 2008/0212370 A1* | 9/2008 | Tokiwa | 365/185.09 |
| 2011/0235420 A1* | 9/2011 | Sharon | G11C 11/5642 365/185.17 |
| 2011/0273935 A1* | 11/2011 | Dong et al. | 365/185.22 |
| 2014/0269070 A1* | 9/2014 | Hsiung | G11C 16/26 365/185.11 |

* cited by examiner

*Primary Examiner* — Richard Elms
*Assistant Examiner* — Ajay Ojha
(74) *Attorney, Agent, or Firm* — McClure, Qualey Rodack, LLP

(57) ABSTRACT

A sensing amplifier comprising a clamp circuit is provided. The clamp circuit is coupled between a first node and a second node. The clamp circuit comprises a first P-type transistor having a first terminal, a second terminal and a control terminal receiving a first bias signal, the first terminal and the second terminal of the first P-type transistor are coupled to the first node and the second node, respectively, and a sensing current from the memory cell flows into the second node via the first node during a sensing time period.

25 Claims, 3 Drawing Sheets

SENSING AMPLIFIER UTILIZING BIT LINE CLAMPING DEVICES AND SENSING METHOD THEREOF

BACKGROUND OF THE INVENTION

Field of the Invention

The invention relates in general to a sensing amplifier and a sensing method thereof, and more particularly to a sensing amplifier capable of sensing current and a sensing method thereof.

Description of the Related Art

With the development of technology, non-volatile memory such as flash memory has been widely applied in various electronic products. Generally, when data is to be read from a memory cell of a flash memory, a sensing amplifier is used to sense and determine the data stored in the selected memory cell. Therefore, there is a need for a sensing amplifier capable of effectively sensing the data stored in the memory cell.

SUMMARY OF THE INVENTION

The invention is directed to a sensing amplifier and a sensing method thereof. The sensing amplifier is capable of sensing the data stored in the memory cell in a way of reverse current sensing, and compensating the variance of the threshold voltage of the memory cell.

According to an aspect of the present invention, a sensing amplifier for sensing data stored in a memory cell is provided. The sensing amplifier comprises a clamp circuit. The clamp circuit is coupled between a first node and a second node. The clamp circuit comprises a first P-type transistor having a first terminal, a second terminal and a control terminal receiving a first bias signal, the first terminal and the second terminal of the first P-type transistor are coupled to the first node and the second node, respectively, and a sensing current from the memory cell flows into the second node via the first node during a sensing time period.

According to another aspect of the present invention, a sensing method of a sensing amplifier is provided. The sensing method comprises the following steps of: providing a sensing amplifier comprising a clamp circuit, the clamp circuit being coupled between a first node and a second node; and providing a first bias signal to a control terminal of a first P-type transistor of the clamp circuit, wherein the first terminal and the second terminal of the first P-type transistor are coupled to the first and second nodes, respectively, and a sensing current from the memory cell flows into the second node via the first node during a sensing time period.

The above and other aspects of the invention will become better understood with regard to the following detailed description of the preferred but non-limiting embodiments. The following description is made with reference to the accompanying drawings.

DETAILED DESCRIPTION OF THE INVENTION

First Embodiment

Figure 1:
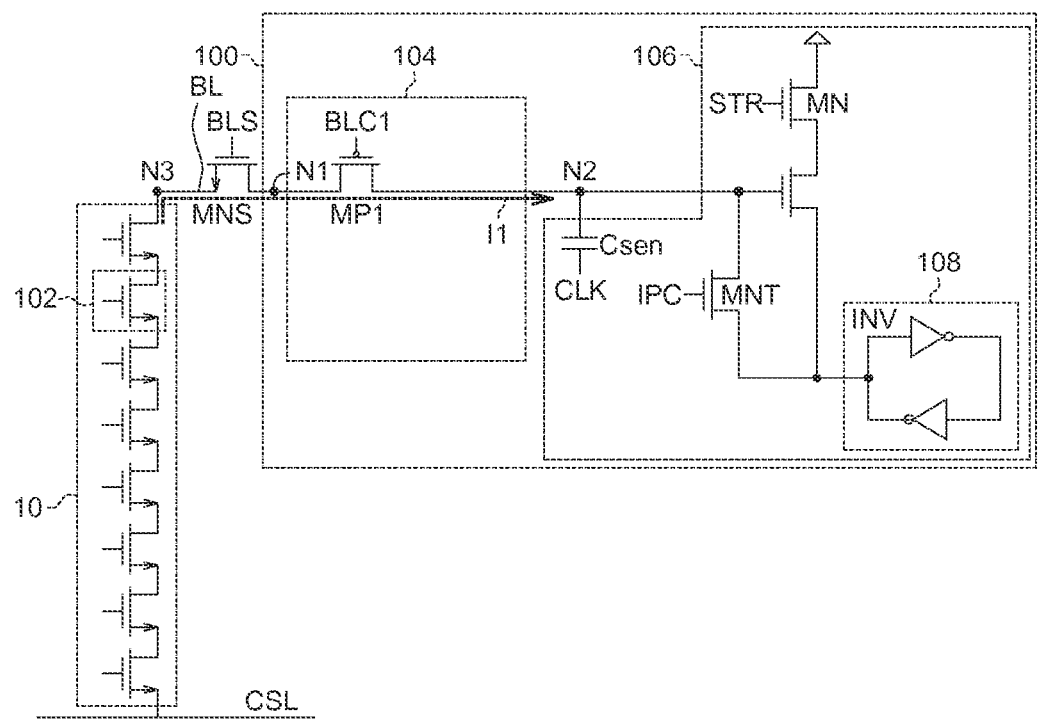
FIG. 1 is a circuit diagram of a sensing amplifier and a memory according to the first embodiment of the present invention.
Figure 2:
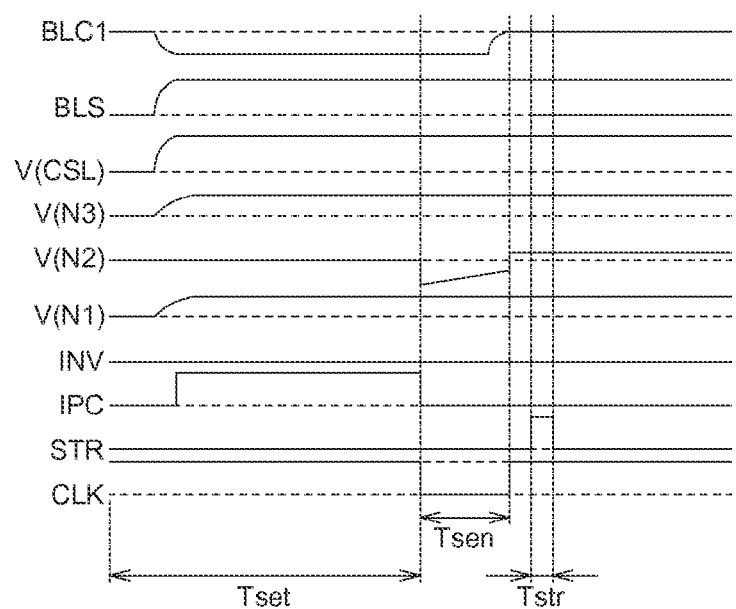
FIG. 2 is a waveform diagram of the related operating signals of the sensing amplifier.

Referring to FIG. 1 and FIG. 2, FIG. 1 shows a circuit diagram of a sensing amplifier 100 and a memory 10 according to the first embodiment of the present invention. FIG. 2 shows a waveform diagram of the related operating signals of the sensing amplifier 100. The memory 10 comprises a number of memory cells 102 for storing data. The sensing amplifier 100 is for sensing data stored in the memory cell 102 through a bit line BL. The sensing amplifier comprises a clamp circuit 104 and a pre-charging and sensing circuit 106. The clamp circuit 104, coupled between a first node N1 and a second node N2, is for making the voltage level of the first node N1 higher than the second node N2 at least during a sensing time period Tsen. The clamp circuit 104 comprises a first P-type transistor MP1 having a first terminal, a second terminal and a control terminal receiving a first bias signal BLC1. The first terminal and the second terminal of the first P-type transistor MP1 are coupled to the first node N1 and the second node N2, respectively, and a sensing current from the memory cell 102 flows into the second node N2 via the first node N1 during the sensing time period Tsen. The pre-charging and sensing circuit 106, coupled to the second node N2, is for determining the data stored in the memory cell 102 according to the voltage level of the second node N2 after the sensing time period Tsen. For example, the first P-type transistor MP1 is a P-type metal-oxide-semiconductor field-effect transistor (MOSFET). The memory 10 is a non-volatile memory, such as NAND flash memory, and the memory cell 102 is a memory cell of the non-volatile memory.

The isolating transistor MNS is coupled between the first node N1 and the third node N3, and controlled by an isolating control signal BLS. The isolating control signal BLS is configured to determine whether the sensing amplifier 100 is isolated from the memory cell 102.

The pre-charging and sensing circuit 106 comprises a sensing capacitor Csen. One terminal of the sensing capacitor Csen is coupled to the second node N2, and the other terminal of the sensing capacitor Csen receives a clock signal CLK. The pre-charging and sensing circuit 106 further comprises a latch 108 and a transistor MNT. In this embodiment, the latch 108 comprises two inverters mutually connected to each other, for latching a control voltage INV. For example, the control voltage INV has two voltage level states, a high voltage level state and a low voltage level state. The transistor MNT has a first terminal, a second terminal and a control terminal receiving a transmitting control signal IPC. The first terminal and the second terminal of the transistor MNT are coupled to the second node N2 and the latch 108, respectively.

For better illustrations of the operation of the sensing amplifier 100, descriptions are given with reference to the waveform diagram in FIG. 2 below.

First, the voltage levels of the nodes N1, N2 and N3 (denoted as V(N1), V(N2) and V(N3) in FIG. 2, respectively) are set to be appropriate to sense the memory cell 102 during the bias setup time period Tset. In this bias setup time period Tset, the voltage level of the common source line CSL of the memory cell 102 is risen to a high voltage level (e.g. 1.5 volt), and the voltage level of the first node N1 is gradually risen to a target voltage level. The target voltage level is less than the voltage level of the common source line CSL. In other words, at this time, the first node N1 is coupled to the source of the memory cell 102, and the common source line CSL is coupled to the drain of the memory cell 102. When the bias setup is completed, the voltage level of the first terminal of the first P-type transistor MP1 (i.e. the voltage level of the first node N1) is clamped to a voltage level that is higher than the first bias signal BLC1 by a threshold voltage. Besides, the transmitting control signal IPC is enabled to turn on the transistor MNT during the bias setup time period Tset, and the control voltage INV of low voltage level (for example, ground level, such as 0 Volt) is transmitted to the second node N2, so that the voltage level of the first node N1 is higher than the voltage level of the second node N2.

Then, the voltage level of the clock signal CLK is pulled low in the beginning of the sensing time period Tsen, so that the voltage level of the second node N2 is pulled low, and the voltage difference between the first node N1 and the second node N2 is increased. Then, during the sensing time period Tsen, assuming that the threshold voltage of the memory cell 102 is low threshold voltage, the sensing current is generated. The sensing current form the memory cell 102 flows along a path (as denoted an arrow I1 in FIG. 1) defined by the third node N3, the isolating transistor MNS, the first node N1, the first P-type transistor MP1 of the clamp circuit 104, and the second node N2 to charge the second node N2. Therefore, compared with the approach that the voltage level of the clock signal CLK is not pulled low in the beginning of the sensing time period Tsen, since the voltage difference between the first terminal and the second terminal of the first P-type transistor MP1 is increased, the saturation window of the first P-type transistor MP1 is accordingly enlarged (i.e. the voltage range that the first P-type transistor MP1 maintains in saturation region during operating is enlarged). Thus, the chance that the first P-type transistor MP1 operates in triode region is reduced.

Beside, during the sensing time period Tsen, the first node N1 is coupled to the source of the memory cell 102, and the sensing current flows from the source of the memory cell 102 into the sensing amplifier 100. Since the transmitting control signal IPC is disabled during the sensing time period Tsen, the transistor MNT is turned off. Accordingly, the sensing current charges the sensing capacitor Csen to accumulate charges on the sensing capacitor Csen when the sensing current flows into the second node N2, thereby the voltage level of the second node N2 is gradually increased.

In the end of the sensing time period Tsen, the first bias signal BLC1 is disabled to turn off the first P-type transistor MP1, then the clock signal CLK is pulled high, so that the voltage level of the second node N2 is pulled high correspondingly. The voltage level of the second node N2 which is pulled high is used to determine the data stored in the memory cell 102 during the data determination time period Tstr. Then, the voltage sensing signal STR used for controlling the reading of memory data is enabled to turn on the transistor MN, so that the pre-charging and sensing circuit 106 is capable of determining the data stored in the memory cell 102 according to the voltage level of the second node N2.

Second Embodiment

Figure 3:
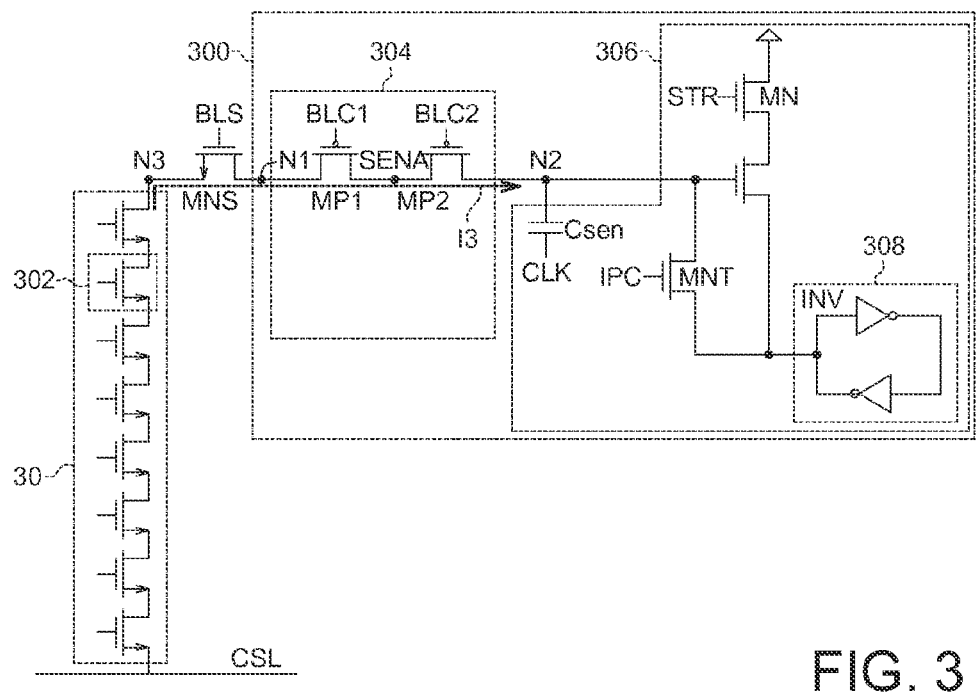
FIG. 3 is a circuit diagram of a sensing amplifier and a memory according to the second embodiment of the present invention.

FIG. 3 shows a circuit diagram of a sensing amplifier 300 and a memory 30 according to the second embodiment of the present invention. The main difference from the first embodiment relies in that the clamp circuit 304 of the sensing amplifier 300 further comprises a second P-type transistor MP2. The second P-type transistor MP2 has a first terminal, a second terminal and a control terminal receiving a second bias signal BLC2. The first terminal (connected to the node SENA in FIG. 3) and the second terminal of the second P-type transistor MP2 are coupled to the second terminal of the first P-type transistor MP1 and the second node N2, respectively. Similar to the first P-type transistor MP1, the voltage level of the first terminal of the second P-type transistor MP2 is clamped to a voltage level that is higher than the second bias signal BLC2 by a threshold voltage when the bias setup is completed, wherein the voltage level of the second bias signal BLC2 is less than the voltage level of the first bias signal BLC1 (ex:−0.25V). The sensing amplifier 300 senses the memory cell 302 during the sensing time period Tsen, so that a sensing current form the memory cell 302 flows along a path (as denoted an arrow in FIG. 3) defined by the third node N3, the isolating transistor MNS, the first node N1, the first P-type transistor MP1 of the clamp circuit 304, the second P-type transistor MP2 and the second node N2 to charge the second node N2.

Third Embodiment

Figure 4:
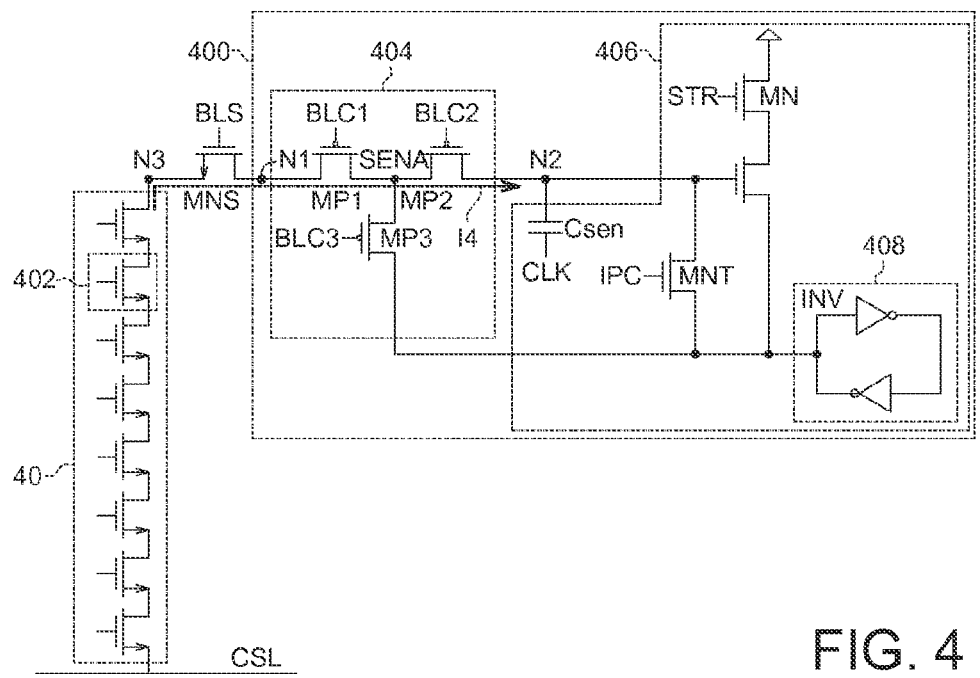
FIG. 4 is a circuit diagram of a sensing amplifier and a memory according to the third embodiment of the present invention.

FIG. 4 shows a circuit diagram of a sensing amplifier 400 and a memory 40 according to the third embodiment of the present invention. The main difference between this embodiment and the second embodiment relies in that the clamp circuit 404 of the sensing amplifier 400 further comprises a third P-type transistor MP3. The third P-type transistor MP3 has a first terminal, a second terminal and a control terminal receiving a third bias signal BLC3. The first terminal (connected to the node SENA in FIG. 4) and the second terminal of the third P-type transistor MP3 are coupled to the second terminal of the first P-type transistor MP1 and the pre-charging and sensing circuit 406, respectively, wherein the voltage level of the first bias signal BLC1 is higher than the voltage level of the third bias signal BLC3 (ex:0.25V), and the voltage level of the third bias signal BLC3 is higher than the voltage level of the second bias signal BLC2 (ex:0.25V).

Figure 5:
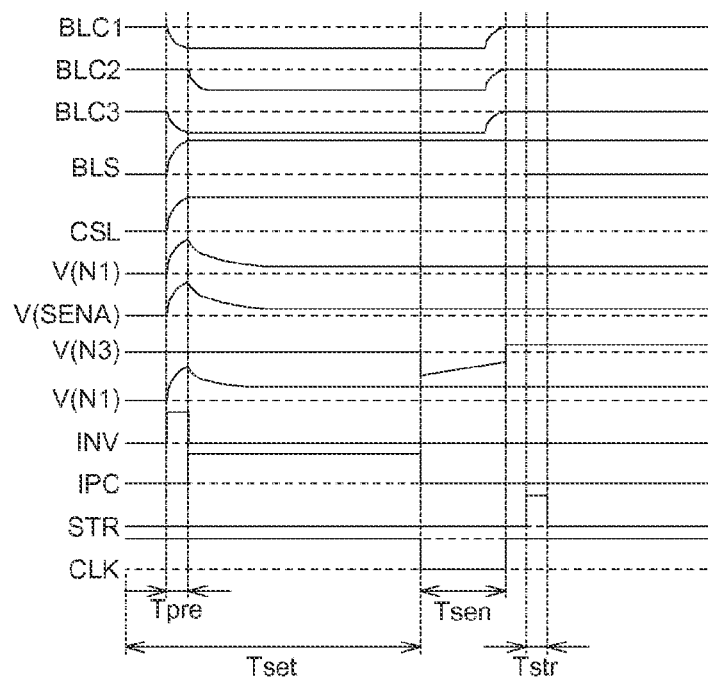
FIG. 5 is a waveform diagram of the related operating signals of the sensing amplifier.

FIG. 5 shows a waveform diagram of the related operating signals of the sensing amplifier 400. As shown in FIG. 5, the bias setup time period Tset further includes a pre-charging time period Tpre. During the pre-charging time period Tpre, the second bias signal is disabled to isolate the first node N1 from the second node N2. At this time, the pre-charging and sensing circuit 406 pre-charges the third node N3 through a path defined by the latch 408, the third P-type transistor MP3, the node SENA, the first P-type transistor MP1, the first node N1, the isolating transistor MNS and the third node N3, so that the voltage level of the third node N3 is risen to a voltage level that is slightly higher than the target voltage level. Thus, the time needed for the voltage level of the third node N3 to achieve the target voltage level can be reduced. The present invention is not limited to the above examples. The third node N3 may be pre-charged by other bit line pre-charging manners. Or, the pre-charging and sensing circuit 406 may not pre-charge the third node N3, and the voltage level of the third node N3 gradually rises to the target voltage level when the sensing amplifier achieves to a stable state.

On the other hand, the first bias signal BLC1 may be used to determine the target voltage level. The target voltage level is high enough to let the sensing current from the memory cell 402 flows from the third node N3 to the second node N2 via the first node N1. Because the first node N1 is coupled to the source of the memory cell 402, the sensing amplifier 400 according to the embodiment of the present invention is capable of controlling the voltage level of the source of the memory cell 402 by adjusting the first bias signal BLC1. Accordingly, by controlling the voltage level of the gate and the voltage level of the source of the memory cell 402, the sensing current variance of the memory cell 402 caused by the variance of threshold voltage can be effectively compensated, thereby the consistency of the sensing current is maintained, and the sensing amplifier 400 can determine the data stored in the memory cell 402 more accurately.

In the end of the pre-charging time period Tpre, the control voltage INV is reset to 0 Volt and then the transmitting control signal IPC is enabled to turn on the transistor MNT to transmit the control voltage INV of a low voltage level (e.g. a grounded voltage, such as 0 Volt) to the second node N2, which is similarly performed in the first embodiment, so that the voltage level of the first node N1 is higher than the voltage level of the second node N2.

When the bias setup is completed, the voltage level of the first terminal of the first P-type transistor MP1 (i.e. the voltage level of the first node N1) is clamped to a voltage level that is higher than the first bias signal BLC1 by a threshold voltage, and the voltage level of the first terminal of the second P-type transistor MP2 (i.e. the voltage level of the node SEAN) is clamped to a voltage level that is higher than the second bias signal BLC2 by a threshold voltage. Moreover, because the voltage level of the third bias signal BLC3 is higher than the voltage level of the second bias signal BLC2, the third P-type transistor MP3 is turned off when the bias setup of each node is completed.

Then, the voltage level of the clock signal CLK is pulled low in the beginning of the sensing time period Tset, so that the voltage level of the second node N2 is pulled low correspondingly at this time. At the same time, the sensing amplifier 400 senses the memory cell 402. Assuming that the threshold voltage of the memory cell 402 is a low threshold voltage, the sensing current is generated. At this time, a sensing current form the memory cell 402 flows along a path (as denoted an arrow I4 in FIG. 4) defined by the third node N3, the isolating transistor BLS, the first node N1, the first P-type transistor MP1 of the clamp circuit 404, the second P-type transistor MP2, and the second node N2 to charge the second node N2. During this sensing time period Tsen, the transmitting control signal IPC is disabled to turn off the transistor MNT. Accordingly, the sensing current charges the sensing capacitor Csen to accumulate charges on the sensing capacitor Csen when the sensing current flows into the second node N2, thereby the voltage level of the second node N2 is gradually increased.

The increase of the voltage level of the second node N2 may raise the voltage level of the node SENA (denoted as V(SENA) in FIG. 5). In such situation, if the voltage level of the node SENA is risen to a voltage level that is sufficient to turn on the third P-type transistor MP3, the third P-type transistor MP3 which is turned on clamps the voltage level of the node SENA to a voltage level that is higher than the second bias signal BLC3 by a threshold voltage, and hence the variance of the voltage level of the node SENA caused by the increase of the voltage level of the second node N2 can be reduced.

In the end of the sensing time period Tsen, the voltage level of the clock signal CLK is pulled high, so that the voltage level of the second node N2 is pulled high correspondingly. Then, the voltage sensing signal STR used for controlling the reading of memory data is enabled to turn on the transistor MN, so that the pre-charging and sensing circuit 406 is capable of determining the data stored in the memory cell 402 according to the voltage level of the second node N2.

Fourth Embodiment

Figure 6:
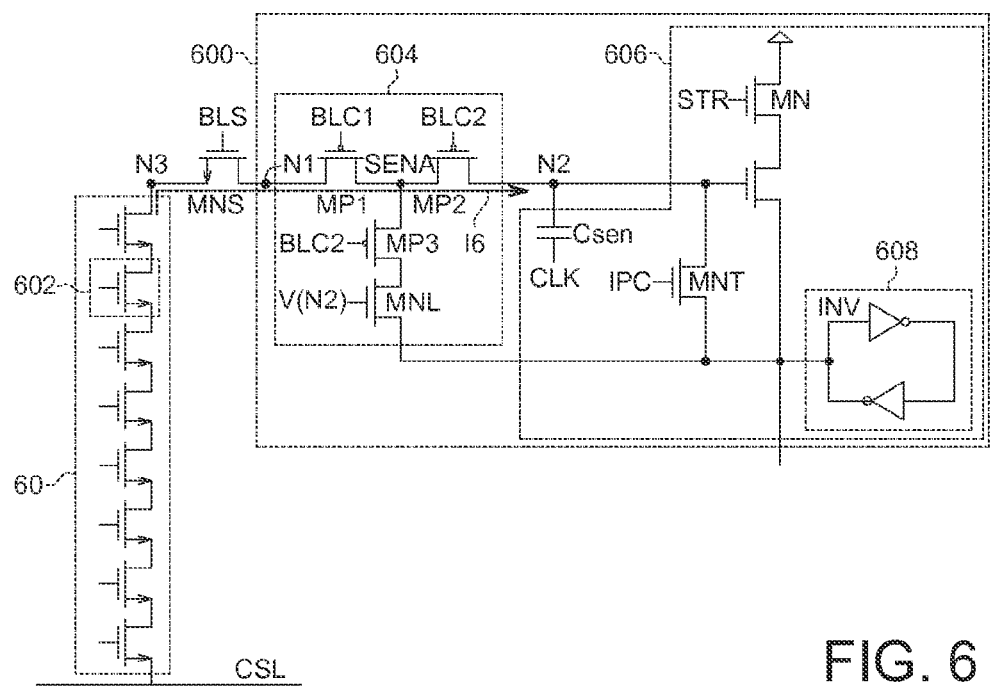
FIG. 6 is a circuit diagram of a sensing amplifier and a memory according to the fourth embodiment of the present invention.

FIG. 6 shows a circuit diagram of a sensing amplifier 600 and a memory 60 according to the fourth embodiment of the present invention. The main difference between this embodiment and the third embodiment relies in that the clamp circuit 604 further comprises a limiting transistor MNL. The limiting transistor MNL has a first terminal, a second terminal and a control terminal receiving the voltage of the second node (denoted as V(N2) in FIG. 6). The first terminal and the second terminal of the limiting transistor MNL are coupled to the second terminal of the third P-type transistor MP3 and the pre-charging and sensing circuit 606, respectively, wherein the voltage level of the first bias signal BLC1 is higher than the voltage level of the second bias signal BLC2, the voltage level of the second bias signal BLC2 can be substantially equal to or less than the voltage level of the third bias signal BLC3. The sensing amplifier 600 senses the memory cell 602 during the sensing time period Tset, so that a sensing current form the memory cell 602 flows along a path (as denoted an arrow I4 in FIG. 6) defined by the third node N3, the isolating transistor MNS, the first node N1, the first P-type transistor MP1 of the clamp circuit 604, the second P-type transistor MP2, and the second node N2 to charge the second node N2.

In this embodiment, if the voltage level of the second node N2 is risen to turn on the limiting transistor MNL, the voltage level of the node SENA is clamped to a voltage level that is higher than the third bias signal BLC3 by a threshold voltage. Thus, the clamp circuit 604 of the present embodiment is capable of avoiding the voltage level of the node SENA being affected by the increasing of the voltage level of the second node N2.

A sensing method of a sensing amplifier is further provided according to the embodiments of the present invention. The sensing method is for sensing data stored in a memory cell. The sensing method includes the following steps. First, a sensing amplifier is provided. The sensing amplifier comprises a clamp circuit. The clamp circuit is coupled between a first node and a second node. Then, a first bias signal is provided to the control terminal of a first P-type transistor of the clamp circuit. The first terminal and the second terminal of the first P-type transistor are coupled to the first node and the second node, respectively. A sensing current from the memory cell flows into the second node via the first node during the sensing time period.

Based on the above, the embodiments of the present invention utilizes a clamp circuit including at least one P-type transistor to make the voltage level of the first node higher than the second node at least during a sensing time period, resulting in that the sensing current form the memory cell may charge the second node of the sensing amplifier, thereby reverse current sensing is achieved. On the other hand, based on the configuration of reverse current sensing, the sensing amplifier is capable of adjusting the voltage level of the source of the memory cell flexibly, and hence the sensing amplifier can determine the data stored in the memory cell more accurately by compensating of the variance of the sensing current caused by the variance of the threshold voltage of the memory cell. While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A sensing amplifier, for sensing data stored in a memory cell of a memory string of which one end is coupled to a third node and another end is coupled to a common source line, comprising:
   a clamp circuit coupled between a first node and a second node, wherein the clamp circuit comprises a first P-type transistor having a first terminal, a second terminal and a control terminal receiving a first bias signal, the first terminal and the second terminal of the first P-type transistor are coupled to the first node and the second node, respectively, and
   an isolating transistor, coupled between the third node and the first node;
   wherein the voltage level of the third node is set to be less than the voltage level of the common source line in a bias setup time period, and the first P-type transistor accordingly clamps the voltage level of the first node to be higher than the voltage level of the second node, such that a sensing current from the memory cell flows into the second node via the first node during a sensing time period subsequent to the bias setup time period.

2. The sensing amplifier according to claim 1, wherein the clamp circuit further comprises:
   a second P-type transistor having a first terminal, a second terminal and a control terminal receiving a second bias signal, wherein the first terminal and the second terminal of the second P-type transistor are coupled to the second terminal of the first P-type transistor and the second node, respectively.

3. The sensing amplifier according to claim 2, wherein the clamp circuit further comprises a third P-type transistor coupled to the second terminal of the first P-type transistor and controlled by a third bias signal.

4. The sensing amplifier according to claim 3, wherein the voltage level of the first bias signal is higher than the voltage level of the third bias signal, and the voltage level of the third bias signal is higher than the voltage level of the second bias signal.

5. The sensing amplifier according to claim 3, wherein the clamp circuit further comprises a limiting transistor coupled to the third P-type transistor and controlled by the voltage of the second node.

6. The sensing amplifier according to claim 5, wherein the voltage level of the first bias signal is higher than the voltage level of the second bias signal, the voltage level of the second bias signal is substantially equal to the voltage level of the third bias signal.

7. The sensing amplifier according to claim 1, further comprises a pre-charging and sensing circuit having a sensing capacitor, wherein one terminal of the sensing capacitor is coupled to the second node, and the other terminal of the sensing capacitor receives a clock signal, wherein the voltage level of the clock signal is pulled low during the sensing time period.

8. The sensing amplifier according to claim 7, further comprises:
   a latch, for latching a control voltage; and
   a transistor having a first terminal, a second terminal and a control terminal receiving a transmitting control signal, the first terminal and the second terminal of the transistor being coupled to the second node and the latch, respectively;
   wherein the transmitting control signal is enabled during the bias setup time period, so that the control voltage is transmitted to the second node.

9. The sensing amplifier according to claim 8, wherein the control voltage is a ground voltage level.

10. The sensing amplifier according to claim 9, wherein the transmitting control signal is disabled to turn off the transistor during the sensing time period.

11. A sensing method, for sensing data stored in a memory cell of a memory string of which one end is coupled to a third node and another end is coupled to a common source line, the sensing method comprising:
    providing a sensing amplifier comprising a clamp circuit, the clamp circuit being coupled between a first node and a second node;
    providing a first bias signal to a control terminal of a first P-type transistor of the clamp circuit, wherein the first terminal and the second terminal of the first P-type transistor are coupled to the first and second nodes, respectively,
    providing an isolating transistor coupled between the third node and the first node; and
    setting the voltage level of the third node to be less than the voltage level of the common source line in a bias setup time period, and accordingly clamping, by the first P-type transistor, the voltage level of the first node to be higher than the voltage level of the second node, such that a sensing current from the memory cell flows into the second node via the first node during a sensing time period subsequent to the bias setup time period.

12. The sensing method according to claim 11, wherein the clamp circuit further comprises a second P-type transistor, the sensing method further comprises:
    providing a second bias signal to a control terminal of the second P-type transistor of the clamp circuit, wherein a first terminal and a second terminal of the second P-type transistor are coupled to the second terminal of the first P-type transistor and the second node, respectively.

13. The sensing method according to claim 12, wherein the clamp circuit further comprises a third P-type transistor, the sensing method further comprises:
    proving a third bias signal to a control terminal of the third P-type transistor of the clamp circuit, wherein the third P-type transistor is coupled to the second terminal of the first P-type transistor.

14. The sensing method according to claim 13, wherein the voltage level of the first bias signal is higher than the voltage level of the third bias signal, and the voltage level of the third bias signal is higher than the voltage level of the second bias signal.

15. The sensing method according to claim 13, wherein the clamp circuit further comprises a limiting transistor, the sensing method further comprises:

providing the voltage of the second node to a control terminal of the limiting transistor of the clamp circuit, wherein the limiting transistor is coupled to the third P-type transistor.

16. The sensing method according to claim 15, wherein the voltage level of the first bias signal is higher than the voltage level of the second bias signal, and the voltage level of the second bias signal is substantially equal to the voltage level of the third bias signal.

17. The sensing method according to claim 11, wherein the sensing amplifier further comprises a pre-charging and sensing circuit including a sensing capacitor, one terminal of the sensing capacitor is coupled to the second node, and the other terminal of the sensing capacitor receives a clock signal, the sensing method further comprise:
pulling the voltage level of the clock signal low in the beginning of the sensing time period.

18. The sensing method according to claim 17, wherein the pre-charging and sensing circuit further comprises a latch and a transistor, a first terminal and a second terminal of the transistor are coupled to the second node and the latch, respectively, the sensing method further comprise:
outputting a control voltage with the latch; and
providing a transmitting control signal to a control terminal of the transistor, and enabling the transmitting control signal to transmit the control voltage to the second node during the bias setup time period.

19. The sensing method according to claim 18, wherein the control voltage is a ground voltage level.

20. The sensing method according to claim 19, further comprising:
disabling the transmitting control signal to turn off the transistor during the sensing time period.

21. A sensing amplifier, for sensing data stored in a memory cell, comprising:
a clamp circuit coupled between a first node and a second node, wherein the clamp circuit comprises a first P-type transistor having a first terminal, a second terminal and a control terminal receiving a first bias signal, the first terminal and the second terminal of the first P-type transistor are coupled to the first node and the second node, respectively;
an isolating transistor, coupled between the first node and a third node coupled to a memory string including the memory cell; and
a pre-charging and sensing circuit having a sensing capacitor, wherein one terminal of the sensing capacitor is coupled to the second node, and the other terminal of the sensing capacitor receives a clock signal, wherein the voltage level of the clock signal is pulled low during the sensing time period;
wherein the voltage level of the third node is set to be less than the voltage level of the common source line in a bias setup time period, and the first P-type transistor accordingly clamps the voltage level of the first node to be higher than the voltage level of the second node, such that a sensing current from the memory cell flows into the second node via the first node during a sensing time period subsequent to the bias setup time period.

22. The sensing amplifier according to claim 21, wherein the clamp circuit further comprises:
a second P-type transistor having a first terminal, a second terminal and a control terminal receiving a second bias signal, wherein the first terminal and the second terminal of the second P-type transistor are coupled to the second terminal of the first P-type transistor and the second node, respectively.

23. The sensing amplifier according to claim 22, wherein the clamp circuit further comprises a third P-type transistor coupled to the second terminal of the first P-type transistor and controlled by a third bias signal.

24. The sensing amplifier according to claim 23, wherein the voltage level of the first bias signal is higher than the voltage level of the third bias signal, and the voltage level of the third bias signal is higher than the voltage level of the second bias signal.

25. The sensing amplifier according to claim 23, wherein the clamp circuit further comprises a limiting transistor coupled to the third P-type transistor and controlled by the voltage of the second node.

* * * * *